(12) United States Patent  
Neema

(10) Patent No.: US 8,161,436 B1
(45) Date of Patent: Apr. 17, 2012

(54) METHOD AND SYSTEM FOR TRANSFORMING FORK-JOIN BLOCKS IN A HARDWARE DESCRIPTION LANGUAGE (HDL) SPECIFICATION

(75) Inventor: Hem C. Neema, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 332 days.

(21) Appl. No.: 12/582,596

(22) Filed: Oct. 20, 2009

(51) Int. Cl.
*G06F 17/50* (2006.01)

(52) U.S. Cl. ....................... 716/104; 716/103
(58) Field of Classification Search .............. 716/103, 716/104; 703/14, 22
See application file for complete search history.

(56) References Cited

U.S. PATENT DOCUMENTS

| | | | |
|---|---|---|---|
| 7,260,798 | B2 | 8/2007 | Gupta et al. |
| 2005/0144585 | A1* | 6/2005 | Daw et al. ................ 716/18 |

OTHER PUBLICATIONS

IEEE, *IEEE Standard for Verilog Hardware Description Language*, IEEE Std 1364-2005, Apr. 7, 2006, pp. 139-143, Sections 9.8-9.8.4, IEEE, New York, New York, USA.

* cited by examiner

*Primary Examiner* — Vuthe Siek
(74) *Attorney, Agent, or Firm* — LeRoy D. Maunu

(57) ABSTRACT

The present invention provides a method, system and article of manufacture for the transformation of parallel blocks into synchronized parallel processes that can be simulated without incurring the overhead of creating extra threads or requiring code modifications in the simulation kernel. This transformation is done in such a way that the parallel behavior is retained in its entirety, and the same simulation time-relative results are produced. The concept of concurrency of processes inherent in HDL languages, including SystemVerilog, is utilized to achieve the same simulation results via the transformed HDL code, which uses the non-parallel block subset of System Verilog HDL.

20 Claims, 3 Drawing Sheets

METHOD AND SYSTEM FOR TRANSFORMING FORK-JOIN BLOCKS IN A HARDWARE DESCRIPTION LANGUAGE (HDL) SPECIFICATION

FIELD OF THE INVENTION

The present invention generally relates to simulation of an electronic circuit design.

BACKGROUND

Hardware Description Languages (HDLs) provide a high-level approach for creating hardware designs. Designs may be as simple as a counter circuit, for example, or as complex as processors and input/output subsystems. The process of event-driven HDL simulation is a way to verify that an HDL-based design will work correctly when implemented in hardware. In order to simulate an HDL design, a model is created for the selected HDL simulator.

One of the more popular HDL languages is System Verilog. Block Statements are one of the key building blocks which comprise the System Verilog language. A block statement provides a means of grouping statements together so that those statements act semantically like a single statement. There are two types of blocks in the System Verilog HDL: sequential blocks, also called begin-end blocks, and parallel blocks, also called fork-join blocks. A parallel block is delimited by the keywords fork and join, fork and join_none, or fork and join_any. The procedural sub-statements in the parallel block are executed concurrently, and the join statement will suspend execution of sequential statements following the block until all sub-statements within the block have completed. If a sub-statement requires more time to complete than the other sub-statements, the join statement will not proceed until the longer statement has completed.

Example 1, shown below, contains an example HDL code segment of a fork-join block and the output resulting from simulation of this HDL code.

```
CODE:
        module m( );
        initial
        begin: parent_process
            #1; $display($time, " parent_process_start");
            fork
                begin: forked_process_1 //Stmt 1
                    #1; $display($time, " forked_process_1");
                end
                begin: forked_process_2 //Stmt 2
                    #1; $display($time, " forked_process_2");
                end
            join
            #1; $display($time, " parent_process_end");
        end
        endmodule
OUTPUT:
        1 parent_process_start
        2 forked_process_1
        2 forked_process_2
        3 parent_process_end
```

Example 1

In the above example, the display sub-statements are executed concurrently and produce the output shown. Another equally correct output is where lines 2 and 3 of the output are interchanged. The "$time" expression of both "Stmt 1" and "Stmt 2" outputs "2" as a result of concurrently executing the statements.

System Verilog design consists of several processes and procedures, each of which may contain a parallel block. Processes execute concurrently from the start of a simulation and will either continually repeat when completed, in the case of Always processes, or will terminate after completing, in the case of Initial processes. A procedure is not executed until it is called by a running process. When an HDL design is simulated, a simulation kernel will allocate memory for each process and add the process to the simulation kernel's scheduler. For each simulation clock cycle the kernel will proceed through each process in the scheduler and execute one clock cycle of the process. When a procedure is called by a process, the procedure runs in the memory of, and uses the scheduled simulation clock cycles of, the process which called it.

Parallel fork-join blocks present a problem for simulation because the simulation kernel needs to execute multiple sub-statements of the parallel block using the memory and simulation clock cycles allocated to single process. To handle this scenario, the simulation kernel is either modified to dynamically allocate memory and time in the scheduler for sub-statements or, more typically, the simulation kernel will create a new thread for each sub-statement. When a thread is executed it is allocated clock cycle time by the operating system and is outside the control of the simulation kernal. This requires additional scheduling to synchronize the execution of processes running in threads with processes running in the simulator. Furthermore, the use of threads requires additional memory for the implementation of each thread. In the case of an Always process containing a parallel fork-join block, a thread would be spawned each time the process is repeated adding processing overhead as well.

The present invention may address one or more of the above issues.

SUMMARY

In some of the various embodiments of the invention, a method is provided for transforming fork-join blocks in a hardware description language specification. For each sub-statement within a fork-join block contained within a parent process within the specification, a specification of a free-running process is created. Each sub-statement from the fork-join block is copied into the respective specification of the free-running process. Timing constructs, controlled by a single first synchronization variable unique to the fork-join block, are placed in the specification of the parent process and in the specification of each free-running process. The timing constructs are configured to trigger execution of the free-running processes and to suspend execution of the parent process in response to the parent process initializing the first variable. The timing constructs also cause the parent process to resume execution in response to adjustments to the variable by the free-running processes indicating that the free-running processes have completed. The specification of each free-running process including the timing constructs is stored in a memory and the specification of a modified version of the parent process, including the timing constructs and not including the fork-join block, is also stored in the memory.

The creating, copying, and placing are performed by a programmed computer.

In another embodiment, a system is provided for transforming fork-join blocks in a hardware description language specification. The system includes a processor, memory, an input/output unit, and storage coupled to a common bus. The processor and memory are configured to create a specification of a free-running process for each sub-statement within a fork-join block that is contained in a specification of a parent process. The processor and memory are configured to copy each sub-statement from the fork-join block into the respective specification of the free-running process. The processor and memory are further configured to place timing constructs, controlled by a single synchronization variable unique to the fork-join block, in the specification of the parent process and in the specification of each free-running process. The timing constructs are configured to trigger execution of the free-running processes and to suspend execution of the parent process in response to the parent process initializing the first variable. The timing constructs are further configured to resume execution of the parent process in response to adjustments to the variable by the free-running processes indicating that the free-running processes have completed. The processor and memory are further configured to store a specification of each free-running process including the timing constructs. The processor and memory are also configured to store a specification of a modified version of the parent process including the timing constructs and not including the fork-join block.

An article of manufacture for transforming fork-join blocks in a hardware description language specification is provided in another embodiment. The article is characterized by an electronically readable storage medium configured with instructions for causing a processor to create a specification of a free-running process for each sub-statement within a fork-join block that is contained in a specification of a parent process. The instructions are further configured to cause a processor to copy each sub-statement from the fork-join block into the respective specification of the free-running process. The instructions are further configured to cause a processor to place timing constructs, controlled by a single first synchronization variable unique to the fork-join block, in the specification of the parent process and in the specification of each free-running process. The timing constructs trigger execution of the free-running processes and suspends execution of the parent process in response to the parent process initializing the first variable. The timing constructs are further configured to resume execution of the parent process in response to adjustments to the variable by the free-running processes indicating that the free-running processes have completed. The instructions further cause a processor to store a specification of each free-running process including the timing constructs and store a specification of a modified version of the parent process including the timing constructs and not including the fork-join block.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

The present invention provides a method, system, and article of manufacture for the transformation of parallel blocks into synchronized concurrent processes that can be simulated without incurring the overhead of creating extra threads or requiring code modifications in the simulation kernel. HDL code of sub-statements contained within a parallel block is transformed into a combination of Initial or Always processes coupled with minor modifications to the processes or subprograms which contain the parallel blocks. This transformation is done in such a way that the parallel behavior is retained in its entirety, and the same simulation time-relative results are produced. The concept of concurrency of processes inherent in HDL languages, including System Verilog, is utilized to achieve the same simulation results via the transformed HDL code, which uses the non-parallel block subset of System Verilog HDL.

Figure 1:
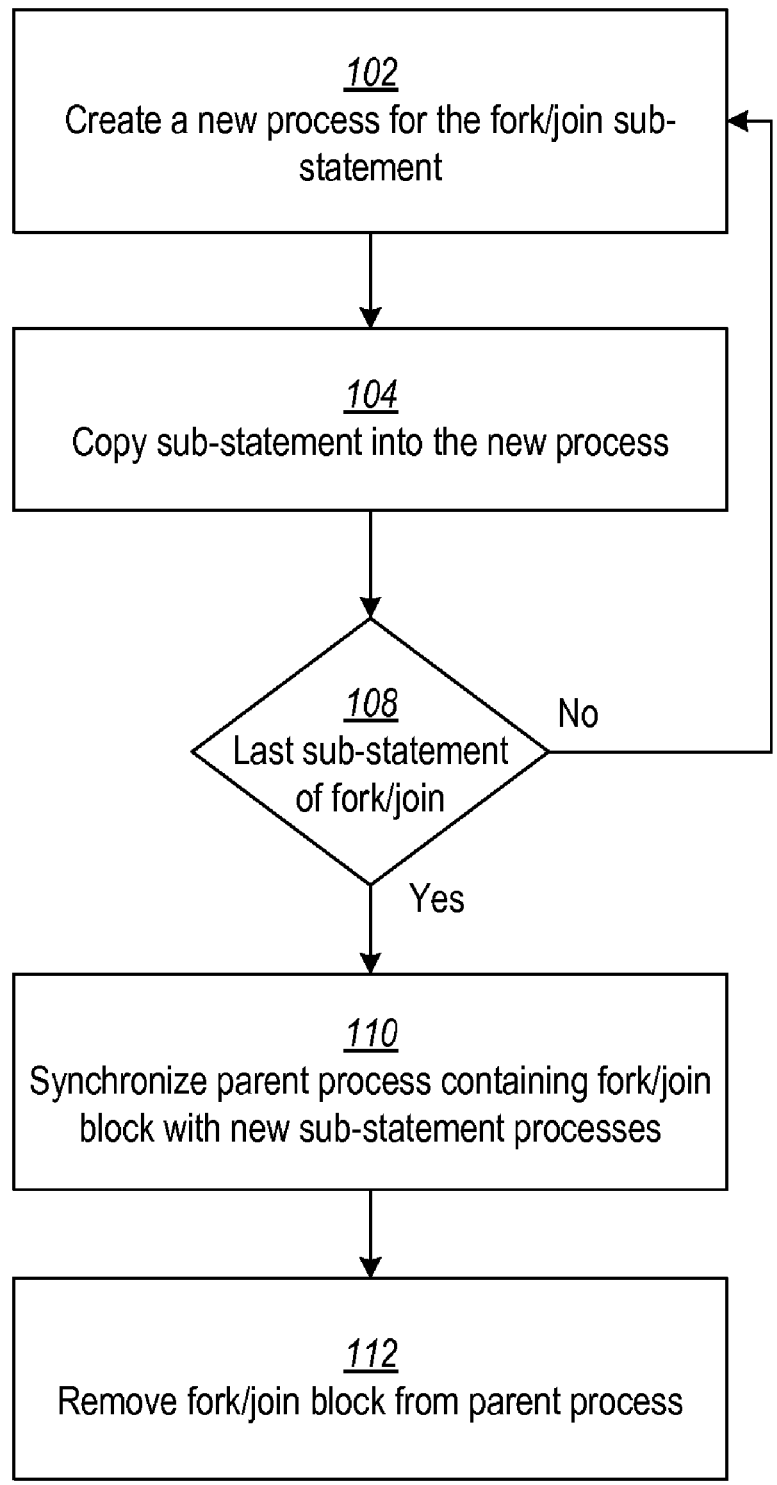
FIG. 1 illustrates a flowchart of a process to convert an HDL fork-join block into synchronized parallel processes in accordance with various embodiments of the invention.

FIG. 1 illustrates a flowchart of a process to convert an HDL fork-join block into synchronized parallel processes in accordance with various embodiments of the invention. For each sub-statement within the fork-join block, a new process block is created at step 102, and the sub-statement is copied into the new process block at step 104. The type of new process block created is of the same type as the parent process which contains the fork-join block. For example, if the parent process is an Always process, the new process block created will be an Always process as well. These steps are repeated while there are more sub-statements 108.

The new process blocks of each sub-statement are synchronized with the parent process containing the fork-join statement at step 110. After synchronization, the fork-join block is removed from the parent process at step 112.

Figure 2:
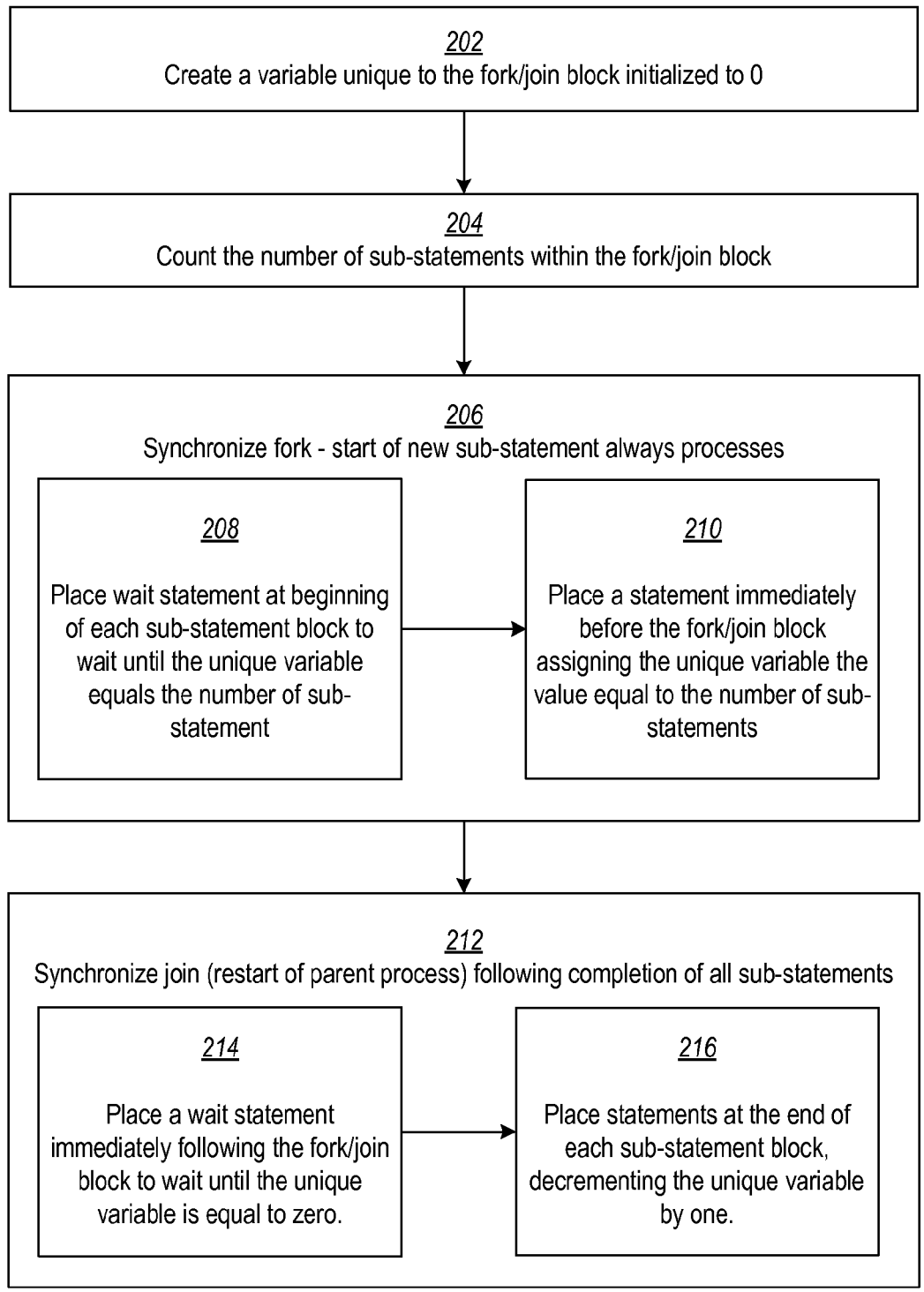
FIG. 2 illustrates, as an example, a flowchart of a process to synchronize parallel sub-statement process blocks with the parent process containing the fork-join block in accordance with various embodiments of the invention.

FIG. 2 illustrates, as an example, a flowchart of a process to synchronize parallel sub-statement process blocks with the parent process containing the fork-join block in accordance with various embodiments of the invention. A synchronization variable unique to the fork-join block is first created and initialized to the value of zero at step 202. The number of sub-statements in the fork-join block is counted at step 204.

The fork statement in which all the sub-statements are executed is synchronized at step 206. To synchronize the fork statement, a wait statement is placed at the beginning of each sub-statement process block at step 208, which causes the sub-statement processes to wait during execution until the unique variable equals the number of sub-statements. Additionally, at step 210, a statement is placed immediately before the fork-join block which assigns the unique variable the value equal to the determined number of sub-statements.

The join statement, where the parent process resumes after all sub-statements have completed, is then synchronized at step 212. To synchronize the join statement, a wait or while statement is placed immediately following the fork-join block at step 214 which causes the parent process during execution to wait until the unique variable is equal to zero. At step 216, statements that decrement the unique variable by one are placed at the end of each sub-statement block.

There are four contexts in which a parallel fork-join block may appear in an HDL design. The contexts include: 1) a parallel block contained in an Initial process, 2) a parallel block contained in an Always process, 3) a parallel block contained within a parallel block, and 4) a parallel block contained within a procedure sub-program. The manner in which the embodiments of the present invention process each instance is described in the examples that follow.

Example 2, shown below, demonstrates the transformation of a parallel fork-join block that appears within an Initial type process. The first code segment is unmodified HDL code, which is followed by code that has been transformed in accordance with various embodiments of the invention. A synchronization variable "r," which is unique to the fork-join block, and two new processes, "forked_process_"1 and "forked_process_2," are created. The first new process implements "Stmt 1" and the second new process implements "Stmt 2." The type of the created processes is the same as the type of the parent process. In this example, Initial type processes are created because the original code process was of the Initial type. The code inside the parent process is also transformed at the place where the parallel block was previously present. The number of new processes created is the number of statements to be concurrently executed inside a fork (not including a child fork statement which is described in Example 4 below).

```
ORIGINAL CODE:
        module m( );
        initial
        begin: parent_process
            #1; $display($time, " parent_process_start");
            fork
                begin: forked_process_1 //Stmt 1
                    #1; $display($time, " forked_process_1");
                end
                begin: forked_process_2 //Stmt 2
                    #1; $display($time, " forked_process_2");
                end
            join
            #1; $display($time, " parent_process_end");
        end
        endmodule
TRANSFORMED CODE
        module m( );
        integer r; //"new"variable created..
        //first "new"process: for Stmt 1
        initial
        begin: forked_process_1
            wait (r ==2);
            #1; $display($time, " forked_process_1");
            #0; r = r −1;
        end
        //second "new" process: for Stmt 2
        initial
        begin: forked_process_2
            wait (r ==2);
            #1; $display($time, " forked_process_2");
            #0; r = r −1;
        end
        //modified parent process
        initial
        begin: parent_process
            #1; $display($time, " parent_process_start");
            r = 2;
            wait (r ==0);
            #1; $display($time, " parent_process_end");
        end
        endmodule
```

Example 2

In simulation of the transformed code of Example 2, all three of the Initial processes start simulating concurrently at simulation time 0. The first and second new processes will wait until the value of r becomes 2 (the number of statements inside the fork). The modified parent process executes the preceding $display statement and then sets the value of r to 2 and then halts it own execution and waits for r to become 0. At this point, the simulation kernel wakes up the two new processes, which were waiting for r to become 2. The two processes execute concurrently, resulting in concurrent execution of "Stmt 1" and "Stmt 2." Once "Stmt 1" and "Stmt 2" are finished, each new process then decrements the value of the shared synchronization variable r by one. Once both the first and the second new processes finish, the value of r becomes 0, which causes the kernel to wake the parent process (as it was waiting for r to become 0). This causes execution of the second $display statement. This sequence of execution causes the exact same simulation results to be produced as the original code.

The delay of 0 ("#0" statements) wherever the synchronization variables are decremented, ensures that all the new processes are synchronized and eliminates race conditions which would potentially alter the simulation results. The processing overhead introduced by the synchronization variable and the new processes is significantly less than that which would be introduced in an implementation involving threads or with modifications to the simulation kernel. A kernel implementation would involve expensive kernel calls in the generated code besides increasing the run-time kernel memory footprint. HDL simulators are well equipped to deal with many variables, and the introduction of a few new variables has minimal impact. Similarly, HDL simulators optimize HDL processes and the addition of a few new processes has minimal impact on a simulator kernel or simulation performance.

Example 3, shown below, demonstrates the transformation of a parallel fork-join block that appears within an always type process. The transform in this case is almost identical to that in Example 2, except that the newly created processes are of the Always type and not of the Initial type.

```
ORIGINAL CODE:
        module m( );
        always
        begin: parent_process
            pre_fork_stmts;
            fork
                fork_stmt_1;
                fork_stmt_2;
            join
            post_fork_stmts;
        end
        endmodule
TRANSFORMED CODE:
        module m( );
        integer r; //"new" variable introduced.
        always begin: forked_stmt_1 //new proc1
            wait (r ==2);
            fork_stmt_1;
            #0; r = r −1;
        end
        always begin: forked_stmt_2 //new proc2
            wait (r ==2);
            fork_stmt_2;
            #0; r = r −1;
        end
        always
```

```
begin: parent_process
  pre_fork_stmts;
  r = 2;
  wait (r ==0);
  post_fork_stmts
end
endmodule
```

Example 3

The language semantics of Example 3 dictate that once the pre_fork1_stmts are executed, parent process triggers the execution of forked_stmt_1 and forked_stmt_2 via the shared synchronization variable r. Forked_stmt_1 and forked_stmt_2 execute concurrently and when finished, trigger the parent process to execute post_fork statements.

Example 4, shown below, demonstrates the transformation of a parallel fork-join block that appears within another parallel fork-join block. The first code segment is the original code which contains a first fork containing the following three sub-statements which are executed sequentially: 1) stmt_1, 2) a second fork-join block, and 3) stmt_4. The second fork-join block contains the following two sub-statements that will execute concurrently: 1) stmt_2, and 2) stmt_3.

```
ORIGINAL CODE:
  module m( );
  initial
  begin: parent_process
    pre_fork1_stmts;
    fork //toplevel fork
      stmt_1;
      fork //child fork
        stmt_2;
        stmt_3;
      join //child fork joined
      stmt_4;
    join //parent fork joined
    post_fork1_stmts;
  end
  endmodule
TRANSFORMED CODE:
  module m( );
  integer r1, r2; //"new" vars
  initial
  begin: stmt_1_proc
    wait (r1 ==3);
    stmt_1;
    #0; r1 = r1 −1;
  end
  initial
  begin: stmt_4_proc
    wait (r1 ==3);
    stmt_4;
    #0; r1 = r1 −1;
  end
  initial
  begin: glue_fork1_&_fork2
    wait (r1 == 3);
    r2 =2;
    wait (r2 == 0);
    #0; r1 = r1 −1;
  end
  initial
  begin: stmt_2_proc
    wait (r2 ==2);
    stmt_2;
    #0; r2 = r2 −1;
  end
```

```
  end
  initial
  begin: stmt_3_proc
    wait (r2 ==2);
    stmt_3;
    #0; r2 = r2 −1;
  end
  initial
  begin: parent_process
    pre_fork1_stmts;
    r1 = 3;
    wait (r1 == 0);
    post_fork1_stmts;
  end
  endmodule
```

Example 4

In transforming the original code of Example 4, two synchronization variables (one for each fork) and five new processes (stmt_1, stmt_2, stmt_3, stmt_4 and one glue process) are created. The parent process executes the pre_fork1_stmts and sets the value of one of the synchronization variable r1 to the number of process blocks created including the glue process. In this case there are three processes: one for stmt_1, one for stmt_2 and one for the glue process (glue_fork1_&_fork2). The parent process then waits for the r1 variable to become 0. When the parent process sets r1 to 3, the simulation kernel schedules stmt_1_proc and stmt_4_proc for execution of stmt_1 and stmt_4. At the same time, the kernel also schedules the execution of the glue process glue_fork1_&_fork2 as it was also waiting for r1 to become 3. This glue process is in charge of controlling the execution of the child fork processes and notifying the completion of the child fork processes to the parent process. When parent_process sets r1 to 3, the glue process starts executing. It sets the value of r2 to 2, which sets up the scheduling of stmt_2_proc and stmt_3_proc to execute stmt_2 and stmt_3, respectively. When both these processes finish, the value of r2 becomes 0, and the glue process executes its next statement which decrements r1. When stmt_1_proc, stmt_2_proc and glue_fork1_&_fork2 have all finished, value of r1 becomes 0 and control passes back to parent_process, which was waiting for r1 to become 0, and post_fork1_stmts can then be executed.

Example 5 shows another way to approach the transformation of a parallel fork-join block that appears within another parallel fork-join block. This approach performs the transformation in iterative steps. The first step transforms the parent fork-join block and treats the child fork-join block as a single sub-process. Three new processes are created for sub-statement stmt_1, sub-statement stmt_4, and the child fork-join block. In addition, a first synchronization variable, r1, is created to control the timing constructs that are placed in the original and new processes.

The second step transforms the new process containing the fork-join block. Two new processes are created for sub-statements stmt_2 and stmt_3 along with a second synchronization variable, r2, which controls the timing constraints placed in the child fork-join process and the new processes created for sub-statements stmt_2 and stmt_3. This process is repeated for each newly created process that contains a fork-join block. In this manner the same transformation as shown in Example 4 is achieved.

```
ORIGINAL CODE:
    module m( );
    initial
    begin: parent_process
        pre_fork1_stmts;
        fork //toplevel fork
            stmt_1;
            fork //child fork
                stmt_2;
                stmt_3;
            join //child fork joined
            stmt_4;
        join //parent fork joined
        post_fork1_stmts;
    end
    endmodule
TRANSFORMATION STEP 1:
    module m( );
    integer r1; //"new" vars
    initial
    begin: stmt_1_proc
        wait (r1 ==3);
        stmt_1;
        #0; r1 = r1 −1;
    end
    initial
    begin: stmt_4_proc
        wait (r1 ==3);
        stmt_4;
        #0; r1 = r1 −1;
    end
    initial
    begin: child_fork_proc
        wait (r1 == 3);
            fork //child fork
                stmt_2;
                stmt_3;
            join //child fork joined
        #0; r1 = r1 −1;
    end
    initial
    begin: parent_process
        pre_fork1_stmts;
        r1 = 3;
        wait (r1 == 0);
        post_fork1_stmts;
    end
    endmodule
TRANSFORMATION STEP 2:
    module m( );
    integer r1, r2; //"new" vars
    initial
    begin: stmt_1_proc
        wait (r1 ==3);
        stmt_1;
        #0; r1 = r1 −1;
    end
    initial
    begin: stmt_4_proc
        wait (r1 ==3);
        stmt_4;
        #0; r1 = r1 −1;
    end
    initial
    begin: child_fork_proc
        wait (r1 == 3);
        r2 =2;
        wait (r2 == 0);
        #0; r1 =r1 −1;
    end
    initial
    begin: stmt_2_proc
        wait (r2 ==2);
        stmt_2;
        #0; r2 = r2 −1;
    end
    initial
    begin: stmt_3_proc
        wait (r2 ==2);
        stmt_3;
        #0; r2 = r2 −1;
    end
    initial
    begin: parent_process
        pre_fork1_stmts;
        r1 = 3;
        wait (r1 == 0);
        post_fork1_stmts;
    end
    endmodule
```

Example 5

Example 6, below, shows the transformation of a parallel fork-join block contained inside a task. As in the previous examples, the first code segment shows the original code which is followed by the transformed code. In the original code, an Initial process calls task t1( ) twice. The task has a fork inside of which there are two statements which should be executed concurrently. In the transformed code, as in the previous examples, two new processes are created for the sub-statements contained within the fork-join block. However, the parent_process in the transformed code in Example 6 remains unchanged. Rather, the task is modified in the manner of the parent process of the previous examples.

The task is modified to set the value of the synchronization variable r to 2 (the number of statements inside the fork) and then wait for r to become 0. When the subprogram is called, r is set to 2 and the two new always processes wake up and will execute stmt_1 and stmt_2. The value of r then becomes 0, the task finishes executing the post_fork_stmts, and the control returns back to the parent process. The parent process then repeats the cycle of calling the task and, as the new Always processes are waiting for r to become 2 again, the whole cycle can repeat exactly as the first call to task t1. The number of unique synchronization variables created is the number of calls to the task from different unique (initial or always) processes. For example, if 3 different processes are calling a task with fork, then 3 different synchronization variables will be created. The number of new Always processes created will be the number of sub-statements inside the fork times the number of unique processes calling the task.

```
ORIGINAL CODE:
    module m( );
    task t1;
    begin
        pre_fork1_stmts;
        fork
            stmt_1;
            stmt_2;
        join
        post_fork_stmts;
    end
    endtask
    initial
    begin: parent_process
        t1( );
        t1( );
    end
    endmodule
TRANSFORMED CODE:
    module m( );
    integer r;
    always
```

-continued

```
        begin
            wait (r == 2);
            stmt1;
            #0; r = r -1;
        end
        always
        begin
            wait (r == 2);
            stmt2;
            #0; r = r -1;
        end
        task t1;
        begin
            pre_fork_stmts;
            r = 2;
            wait (r == 0);
            post_fork_stmts;
        end
        endtask
        initial
        begin
            t1( );
            t1( );
        end
    endmodule
```

Example 6

The fork-join block transformation of the present invention is equally applicable to fork-join_any blocks and fork-join_none blocks. A fork-join_any block behaves by executing the block sub-statements concurrently and suspending the parent process. The fork-join_any block is different from a typical fork-join block, however, in that the parent process resumes when any one of the block sub-statements complete. Implementation of the transformation for each of the cases discussed above is the same for the fork-join_any block except that the unique synchronization variable created is initialized to the value of one by the parent process regardless of how many sub-statements are within the fork join block. In this manner, when one of the created free-running processes completes, the value of the synchronization variable is decremented and becomes equal to the value of zero. The parent process is triggered to resume execution concurrently with the unfinished free-running processes.

A fork-join_none block behaves by executing the block sub-statements concurrently. However, the parent process is never suspended. Rather, the parent process and block sub-statements execute concurrently. Implementation of the transformation for each of the cases discussed above is the same for the fork-join_none block except that the no timing construct is created in the parent process to suspend the parent process until the free-running processes have completed. Example 7, below, shows the transformation of a fork-join_none block. Although the synchronization variable no longer needs to be decremented in order to trigger the parent process to resume, the variable must still be decremented in order to prevent the free-running processes from restarting before the parent process restarts, reaches the fork-join_none block and initializes the variable to the number of free-running processes created. Some embodiments of the invention may optimize transformed code by excluding the timing constructs that decrement the synchronization variable when the parent process is of the initial type. In that case, the free-running processes will terminate when completed and will never have to be resumed.

```
ORIGINAL CODE:
    module m( );
        always
        begin: parent_process
            #1; $display($time, " parent_process_start");
            fork
                begin: forked_process_1 //Stmt 1
                    #1; $display($time, " forked_process_1");
                end
                begin: forked_process_2 //Stmt 2
                    #1; $display($time, " forked_process_2");
                end
            join_none
            #1; $display($time, " parent_process_end");
        end
    endmodule
TRANSFORMED CODE
    module m( );
        integer r; //"new"variable created..
        //first "new" process: for Stmt 1
        always
        begin: forked_process_1
            wait (r ==2);
            #1; $display($time, " forked_process_1");
            #0; r = r -1;
        end
        //second "new" process: for Stmt 2
        always
        begin: forked_process_2
            wait (r ==2);
            #1; $display($time, " forked_process_2");
            #0; r =r -1;
        end
        //modified parent process
        always
        begin: parent_process
            #1; $display($time, " parent_process_start");
            r = 2;
            #1; $display($time, " parent_process_end");
        end
    endmodule
```

Example 7

Figure 3:
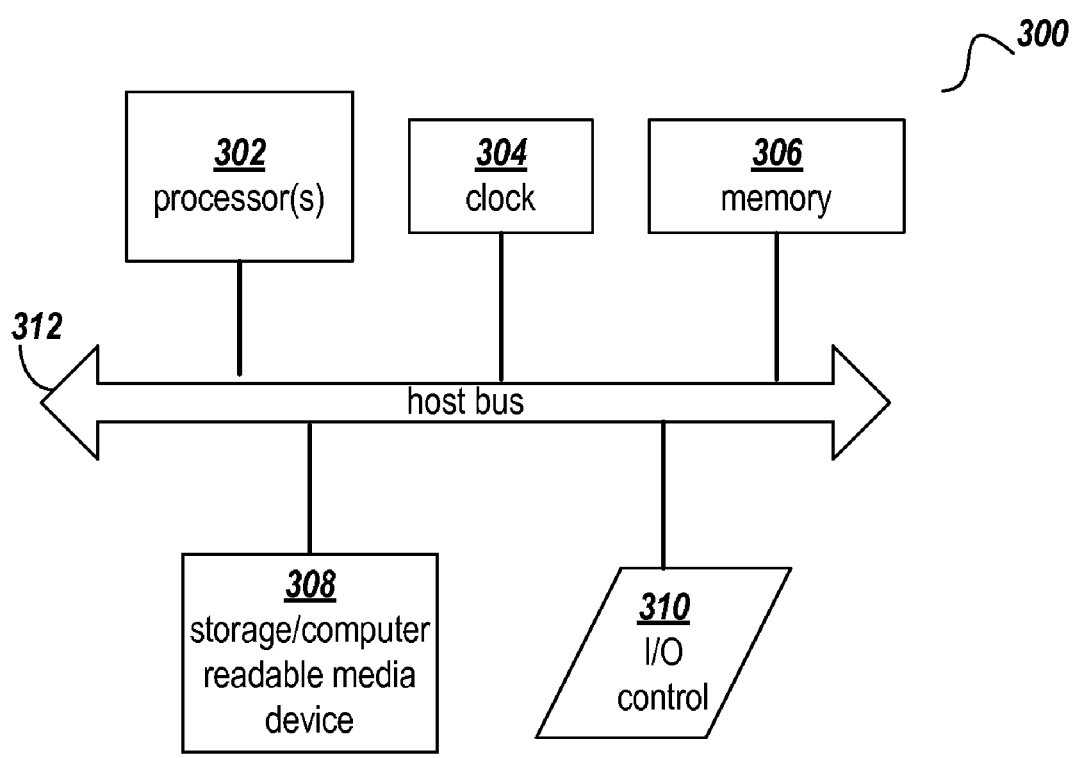
FIG. 3 shows a block diagram of an example computing arrangement which can be configured to implement the processes described herein.

FIG. 3 is a block diagram of an example computing arrangement on which the processes described herein may be implemented. Those skilled in the art will appreciate that various alternative computing arrangements, including one or more processors and a memory arrangement configured with program code, would be suitable for hosting the processes and data structures and implementing the algorithms of the different embodiments of the present invention. The computer code, comprising the processes of the present invention encoded in a processor executable format, may be stored and provided via a variety of computer-readable storage media or delivery channels such as magnetic or optical disks or tapes, electronic storage devices, or as application services over a network.

Processor computing arrangement 300 includes one or more processors 302, a clock signal generator 304, a memory unit 306, a storage unit 308, and an input/output control unit 310 coupled to host bus 312. The arrangement 300 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 302 may be one or more general purpose processors, or a combination of one or more general purpose processors and suitable co-processors, or one or more specialized processors (e.g., RISC, CISC, pipelined, etc.).

The memory arrangement 306 typically includes multiple levels of cache memory, and a main memory. The storage arrangement 308 may include local and/or remote persistent storage such as provided by magnetic disks (not shown), flash, EPROM, or other non-volatile data storage. The storage unit may be read or read/write capable. Further, the memory 306 and storage 308 may be combined in a single arrangement.

The processor arrangement 302 executes the software in storage 308 and/or memory 306 arrangements, reads data from and stores data to the storage 308 and/or memory 306 arrangements, and communicates with external devices through the input/output control arrangement 310. These functions are synchronized by the clock signal generator 304. The resource of the computing arrangement may be managed by either an operating system (not shown), or a hardware control unit (not shown).

The present invention is thought to be applicable to a variety of systems for a data bus controller. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of transforming fork-join blocks in a hardware description language (HDL) specification, comprising:
   creating a respective HDL specification of a free-running process for each sub-statement within a fork-join block that is contained in a specification of a parent process;
   copying each sub-statement from the fork-join block into the respective specification of the free-running process;
   placing first timing constructs, controlled by a single first synchronization variable unique to the fork-join block, in the specification of the parent process and in the specification of each free-running process;
   wherein the first timing constructs trigger execution of the free-running processes, suspend execution of the parent process in response to the parent process initializing the first variable, and resume execution of the parent process in response to adjustments to the first variable by the free-running processes indicating that the free-running processes have completed;
   wherein the creating, copying, and placing are performed by a programmed computer;
   storing in a memory an HDL specification of each free-running process including the first timing constructs; and
   storing an HDL specification of a modified version of the parent process including the first timing constructs in the memory, the modified version not including the fork-join block.

2. The method of claim 1, wherein:
   the fork-join block is a fork-join_any block; and
   the first timing constructs placed in the specification of the parent process are configured to resume execution of the parent process in response to adjustments to the first variable by one of the free-running processes indicating that the free-running process has completed.

3. The method of claim 1, wherein:
   the fork-join block is a fork-join_none block; and
   the first timing constructs placed in the specification of the parent process and the specifications of the free-running processes are configured solely to trigger execution of the free-running processes in response to the parent process initializing the first variable.

4. The method of claim 1, wherein:
   the first timing constructs placed in the free-running processes suspend execution of the free-running processes until the first synchronization variable is set to a value equal to the number of free-running processes;
   the parent process containing the first timing constructs triggers execution of the free-running processes containing the first timing constructs by setting the first synchronization variable equal to the number of free-running processes when the parent process reaches the fork-join block;
   each free-running process containing the first timing constructs decrements the first synchronization variable by one upon completion of the free-running process; and
   the suspended execution of the parent process containing the first timing constructs is resumed when the value of the first synchronization variable is equal to zero.

5. The method of claim 1, wherein the placing first timing constructs comprises:
   adding a first statement in the specification of the parent process before the fork-join block, wherein the statement creates a single synchronization variable unique to the fork-join block and initializes the first synchronization variable to a number of sub-statements contained within the fork-join block;
   adding a respective second statement to each free-running process directing the free-running process to wait to commence execution until a value of the first synchronization variable is equal to the number of sub-statements contained within the fork-join block;
   adding a statement to each free-running process directing the process to decrement the value of the first synchronization variable by one upon completing execution; and
   adding a third statement in the parent process directing the parent process to wait to resume execution until the value of the first synchronization variable is equal to zero.

6. The method of claim 5, wherein:
   the fork-join block is a fork-join_any block; and
   the first statement initializes the first synchronization variable to the value of one.

7. The method of claim 1, wherein the free-running process created is of the same type as the parent process containing the fork-joint block.

8. The method of claim 1, further comprising:
   creating an additional HDL specification of an additional free-running process;
   copying each inner sub-statement from the inner fork-join block into the respective specification of the free-running process corresponding to the inner sub-statement;
   creating a respective HDL specification of a free-running process for each inner sub-statement within an inner fork-join block that is contained in a specification of the fork-join block;
   placing second timing constructs, controlled by a single second synchronization variable unique to the inner fork-join block, in the specification of the additional free-running process and in the specification corresponding to each inner sub-statement;
   wherein the second timing constructs trigger execution of the free-running processes corresponding to each inner sub-statement, suspend execution of the additional free-running process in response to the additional free-running process initializing the second variable, and resume execution of the additional free-running process in response to adjustments to the variable by the free-running processes, corresponding to the inner sub-statements, indicating that the free-running processes corresponding to the inner sub-statements have completed;

storing an HDL specification of the additional free-running process and the free-running processes corresponding to the inner sub-statements; and wherein the placing second timing constructs includes the additional free-running process as one of the free-running processes.

9. The method of claim 1, further comprising repeating the creating, copying, placing, and storing steps on each created HDL specification respective to a sub-statement that is a fork-join block, wherein the sub-statement that is a fork-join block is the parent process.

10. A system for transforming fork-join blocks in a hardware description language (HDL) specification, comprising:
a processor;
a common bus coupled to the processor;
a memory unit coupled to the common bus; and
an input/output unit coupled to a common bus;
wherein the processor and memory are adapted to:
create a respective HDL specification of a free-running process for each sub-statement within a fork-join block that is contained in a specification of a parent process;
copy each sub-statement from the fork-join block into the respective specification of the free-running process;
place first timing constructs, controlled by a single first synchronization variable unique to the fork-join block, in the specification of the parent process and in the specification of each free-running process;
wherein the first timing constructs trigger execution of the free-running processes, suspend execution of the parent process in response to the parent process initializing the first variable, and resume execution of the parent process in response to adjustments to the variable by the free-running processes indicating that the free-running processes have completed;
store an HDL specification of each free-running process including the first timing constructs; and
store an HDL specification of a modified version of the parent process including the first timing constructs, the modified version not including the fork-join block.

11. The system of claim 10, wherein the processor and memory are further configured, in the placing of the first timing constructs, to:
add a first statement in the specification of the parent process before the fork-join block, wherein the statement creates a single synchronization variable unique to the fork-join block and initializes the first synchronization variable to a number of sub-statements contained within the fork-join block;
add a respective second statement to each free-running process directing the free-running process to wait to commence execution until a value of the first synchronization variable is equal to the number of sub-statements contained within the fork-join block;
add a statement to each free-running process directing the process to decrement the value of the first synchronization variable by one upon completing execution; and
add a third statement in the parent process directing the parent process to wait to resume execution until the value of the first synchronization variable is equal to zero.

12. The system of claim 10, wherein the processor and memory are further configured to create free-running processes that are of the same type as the parent process containing the fork-joint block.

13. The system of claim 10, wherein the processor and memory are further configured to:
create an additional HDL specification of an additional free-running process;
copy each inner sub-statement from the inner fork-join block into the respective specification of the additional free-running process corresponding to the inner sub-statement;
create a respective HDL specification of a free-running process for each inner sub-statement within an inner fork-join block that is contained in a specification of the fork-join block;
place second timing constructs, controlled by a single second synchronization variable unique to the inner fork-join block, in the specification of the additional free-running process and in the specification corresponding to each inner sub-statement;
wherein the second timing constructs trigger execution of the free-running processes corresponding to the each inner sub-statement, suspend execution of the additional free-running process in response to the additional free-running process initializing the second variable, and resume execution of the additional free-running process in response to adjustments to the variable by the free-running processes, corresponding to the inner sub-statements, indicating that the free-running processes corresponding to the inner sub-statements have completed;
store an HDL specification of the additional free-running process and the free-running processes corresponding to the inner sub-statements; and
wherein the placing of the second timing constructs includes the additional free-running process as one of the free-running processes.

14. The system of claim 10, wherein the processor and memory are further configured to perform creation, copying, placement, and storing functions on each created HDL specification, respective to a sub-statement that is a fork-join block, as if the HDL specification respective to a sub-statement were the parent process.

15. An article of manufacture, comprising a non-transitory electronically readable storage medium configured with instructions for causing a processor to:
create a respective HDL specification of a free-running process for each sub-statement within a fork-join block that is contained in a specification of a parent process;
copy each sub-statement from the fork-join block into the respective specification of the free-running process;
place first timing constructs, controlled by a single first synchronization variable unique to the fork-join block, in the specification of the parent process and in the specification of each free-running process;
wherein the first timing constructs trigger execution of the free-running processes, suspend execution of the parent process in response to the parent process initializing the first variable, and resume execution of the parent process in response to adjustments to the variable by the free-running processes indicating that the free-running processes have completed;

store an HDL specification of each free-running process including the first timing constructs; and store an HDL specification of a modified version of the parent process including the first timing constructs, the modified version not including the fork-join block.

16. The article of manufacture of claim 15, wherein:

the first timing constructs corresponding to the free-running processes suspend execution of the free-running processes until the first synchronization variable is set to a value equal to the number of free-running processes;

the parent process containing the first timing constructs triggers execution of the free-running processes containing the first timing constructs by setting the first synchronization variable equal to the number of free-running processes when the parent process reaches the fork-join block;

each free-running process containing the first timing constructs decrements the first synchronization variable by one upon completion of the free-running process; and the suspended execution of the parent process containing the first timing constructs is resumed when the value of the first synchronization variable is equal to zero.

17. The article of manufacture of claim 15, wherein the non-transitory electronically readable storage medium is further configured with instructions for causing a processor, in placing the first timing constructs, to:

add a first statement in the specification of the parent process before the fork-join block, wherein the statement creates a single synchronization variable unique to the fork-join block and initializes the first synchronization variable to a number of sub-statements contained within the fork-join block;

add a respective second statement to each free-running process directing the free-running process to wait to commence execution until a value of the first synchronization variable is equal to the number of sub-statements contained within the fork-join block;

add a statement to each free-running process directing the process to decrement the value of the first synchronization variable by one upon completing execution; and add a third statement in the parent process directing the parent process to wait to resume execution until the value of the first synchronization variable is equal to zero.

18. The article of manufacture of claim 15, wherein the non-transitory electronically readable storage medium is further configured with instructions for causing a processor to create free-running processes that are of the same type as the parent process containing the fork-joint block.

19. The article of manufacture of claim 15, wherein the non-transitory electronically readable storage medium is further configured with instructions for causing a processor to:

create an additional HDL specification of an additional free-running process;

copy each inner sub-statement from the inner fork-join block into the respective specification of the free-running process corresponding to the inner sub-statement;

create a respective HDL specification of a free-running process for each inner sub-statement within an inner fork-join block that is contained in a specification of the fork-join block;

place second timing constructs, controlled by a single second synchronization variable unique to the inner fork-join block, in the specification of the additional free-running process and in the specification corresponding to each inner sub-statement;

wherein the second timing constructs trigger execution of the free-running processes corresponding to the each inner sub-statement, suspend execution of the additional free-running process in response to the additional free-running process initializing the second variable, and resume execution of the additional free-running process in response to adjustments to the variable by the free-running processes, corresponding to the inner sub-statements, indicating that the free-running processes corresponding to the inner sub-statements have completed;

store an HDL specification of the additional free-running process and the free-running processes corresponding to the inner sub-statements; and wherein the placing of the second timing constructs includes the additional free-running process as one of the free-running processes.

20. The article of manufacture of claim 15, wherein the non-transitory electronically readable storage medium is further configured with instructions for causing a processor to perform creation, copying, placement, and storing steps on each created HDL specification, respective to a sub-statement that is a fork-join block, as if the HDL specification respective to a sub-statement were the parent process.

* * * * *